United States Patent [19]

Nakai et al.

[11] Patent Number: 4,881,100
[45] Date of Patent: Nov. 14, 1989

[54] ALIGNMENT METHOD

[75] Inventors: Akiya Nakai, Tokyo; Bunei Hamasaki, Yokohama; Shinji Utamura, Chofu, all of Japan

[73] Assignee: Canon Kabushiki Kaisha, Tokyo, Japan

[21] Appl. No.: 273,187

[22] Filed: Nov. 16, 1988

Related U.S. Application Data

[63] Continuation of Ser. No. 201,260, May 25, 1988, abandoned, which is a continuation of Ser. No. 938,279, Dec. 5, 1986, abandoned.

[30] Foreign Application Priority Data

Dec. 10, 1985 [JP] Japan .................... 60-275923
Dec. 10, 1985 [JP] Japan .................... 60-275924

[51] Int. Cl.$^4$ ............. G03B 27/42; G01B 11/00
[52] U.S. Cl. ........................... 355/53; 250/548
[58] Field of Search .............. 355/53, 77; 250/548

[56] References Cited

U.S. PATENT DOCUMENTS

| 4,345,836 | 8/1982 | Phillips | 355/53 |
| 4,597,664 | 7/1986 | Johannsmeier et al. | 355/53 |
| 4,613,230 | 9/1986 | Iwai | 355/53 |
| 4,669,867 | 6/1987 | Uda et al. | 355/53 |
| 4,712,016 | 12/1987 | Matsumura | 250/548 |
| 4,719,357 | 1/1988 | Ayata et al. | 250/548 |

Primary Examiner—Donald A. Griffin
Attorney, Agent, or Firm—Fitzpatrick, Cella, Harper & Scinto

[57] ABSTRACT

An alignment method usable in an apparatus for transferring images of a pattern of a mask onto different portions of a semiconductor wafer in a step-and-repeat manner, is disclosed. In this alignment method, positional deviation of at least one portion of the wafer with respect to the mask is measured and, on the basis of this measurement, the mask and the wafer are aligned with each other. After this, step-and-repeat exposure is executed. When the measurement of the positional deviation of the at least one portion of the wafer is unattainable, another portion of the wafer is selected and the deviation measurement is executed in respect to the selected portion. In another aspect of the invention, with regard to a rotational component of the deviation of the wafer, measurement and alignment are repeatedly executed until the rotational component becomes less than a predetermined value. Thereafter, the step-and-repeat exposure is initiated.

9 Claims, 5 Drawing Sheets

ALIGNMENT METHOD

This application is a continuation of application Ser. No. 201,260 filed May 25, 1988 now abandoned, which is a continuation of application Ser. No. 938,279 filed Dec. 5, 1986, now abandoned.

FIELD OF THE INVENTION AND RELATED ART

This invention relates to an alignment method and, more particularly to an alignment method usable, in semiconductor device manufacturing processes or the like, for accurately transferring by projection exposure images of a pattern of a mask onto different shot areas on a semiconductor wafer in a step-and-repeat manner.

In the field of manufacture of semiconductor devices such as integrated circuits, step-and-repeat type reduction projection exposure apparatuses are used for photolithographically transferring images of a circuit pattern formed on a mask or reticle onto a wafer. More specifically, in this type of exposure apparatuses, projection optics such as a projection lens system having a reduced imaging magnification are used to project, in a reduced scale, the image of the pattern of the mask or reticle onto the wafer. Each time the image of the mask pattern is transferred onto the wafer, the wafer is moved stepwise so that the image of the mask pattern is transferred onto another shot area on the wafer. By repeating this procedure, all the shot areas on the wafer are exposed to the mask pattern. This is called "step-and-repeat exposure".

For mask-to-wafer alignment, in this type of exposure apparatus, for assuring an image of the mask pattern to be accurately overlaid upon a pattern or patterns which have already been photoprinted on the wafer, usually a deviation detecting operation for detecting any positional deviation of the wafer with respect to the reticle pattern is executed in respect to each of the shot areas on the wafer. Also, in some exposure apparatuses, any positional deviation of one or more preselected shot areas with respect to a predetermined reference is detected and, on the basis of results of the detection, the position of the wafer is adjusted for the sake of the step-and-repeat exposure to be effected subsequently. The former is called "die-by-die alignment" while the latter is called "global alignment".

SUMMARY OF THE INVENTION

A primary object of the present invention is to provide an improved alignment method usable, in advance of the step-and-repeat exposure or the like of a workpiece such as a semiconductor wafer, for detecting any deviation of at least one particular region of the workpiece with respect to a predetermined reference such as an image of a pattern of a mask and for positioning the workpiece on the basis of the detection of the deviation.

In accordance with an aspect of the present invention, there is provided an alignment method, usable with a workpiece having different portions, for positioning one by one the different portions of the workpiece with respect to a predetermined reference, said method comprising the steps of detecting deviation of at least one of the different portions of the workpiece with respect to the reference; discriminating whether the detection has been achieved; and positioning one by one the different portions of the workpiece with respect to the reference in accordance with the detection of the deviation of said at least one portion, when the achievement of the detection is discriminated.

In another aspect of the present invention, there is provided an alignment method, usable with a workpiece having different portions, for positioning one by one the different portions of the workpiece with respect to a predetermined reference, wherein at least two portions of the workpiece have alignment marks, said method comprising the steps of detecting a said alignment mark of at least one portion of the workpiece; discriminating whether the detection of the alignment mark is achieved; detecting a said alignment mark of a said portion of the workpiece, which portion is in the neighborhood of said at least one portion, when the achievement of the detection of the alignment mark is not discriminated; and positioning one by one the different portions of the workpiece with respect to the reference in accordance with the detection of the alignment mark of said at least one portion when the achievement of the detection of the alignment mark of said at least one portion is discriminated, and in accordance with the detection of the alignment mark of the neighboring portion when the achievement of the detection of the alignment mark of said at least one portion is not discriminated.

In a further aspect of the invention, there is provided an alignment method for positioning a workpiece with respect to a predetermined reference, said method comprising the steps of placing the workpiece on a support which is movable in first and second detections and in a rotational direction lying in a plane containing the first and second directions; detecting deviation of the workpiece placed on the support, with respect to the reference; discriminating whether a rotational component of the detected deviation is not greater than a predetermined value; and adjusting a position of the support in the first and second directions in accordance with the detected deviation, when the rotational component of the detected deviation is discriminated as being not greater than the predetermined value, thereby to position the workpiece with respect to the reference.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
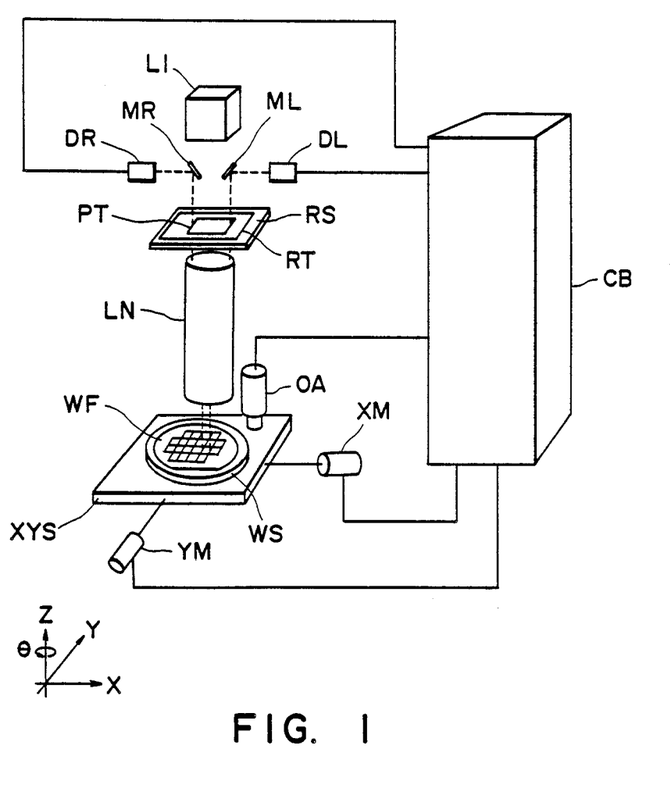
FIG. 1 is a schematic view showing a basic arrangement of a projection exposure apparatus to which an alignment method according to the present invention is applied.

Referring first to FIG. 1, there is schematically shown a basic arrangement of a projection exposure apparatus for use in the manufacture of semiconductor devices. As will be described later in detail, the exposure apparatus of FIG. 1 is of the global alignment type using projection optics. Hereinafter, the manner of such alignment will be referred to also as "TTL (through the lens) global alignment".

Denoted in FIG. 1 by XYS is an X-Y stage for carrying thereon a wafer WF and moving the same in X and Y directions as desired; by XM, a driving motor for moving the X-Y stage XYS in the X direction; by YM, another driving motor for moving the X-Y stage XYS in the Y direction; by WS, a $\theta$ stage mounted on the X-Y stage XYS and supporting the wafer WS, the $\theta$ stage being effective to rotationally displace the wafer WS in the $\theta$ direction; by OA, an off-axis microscope usable for detecting prealignment marks PM1 and PM2 (FIG. 2) so as to roughly position the wafer WF with respect to a reticle RT; by LN, a reduction projection lens system having an optical axis extending in parallel to a Z-axis of an X-Y-Z coordinate system; by RS, a reticle stage for holding the reticle RT for movement in the X, Y and $\theta$ directions; by PT, a circuit pattern formed on the reticle RT which pattern is to be projected onto the wafer WF by means of the projection lens system LN in a reduced scale; by LI, an illumination system for illuminating the reticle RT so that an image of the pattern PT is photoprinted on the wafer WF; by MR and ML, reflecting mirrors; by DR and DL, photoelectric detectors; and by CB, a control box accommodating therein a control circuit which comprises a central processing unit (CPU), memories, etc. The control circuit is arranged to control various operations in the exposure apparatus in accordance with respective predetermined sequences.

Figure 2:
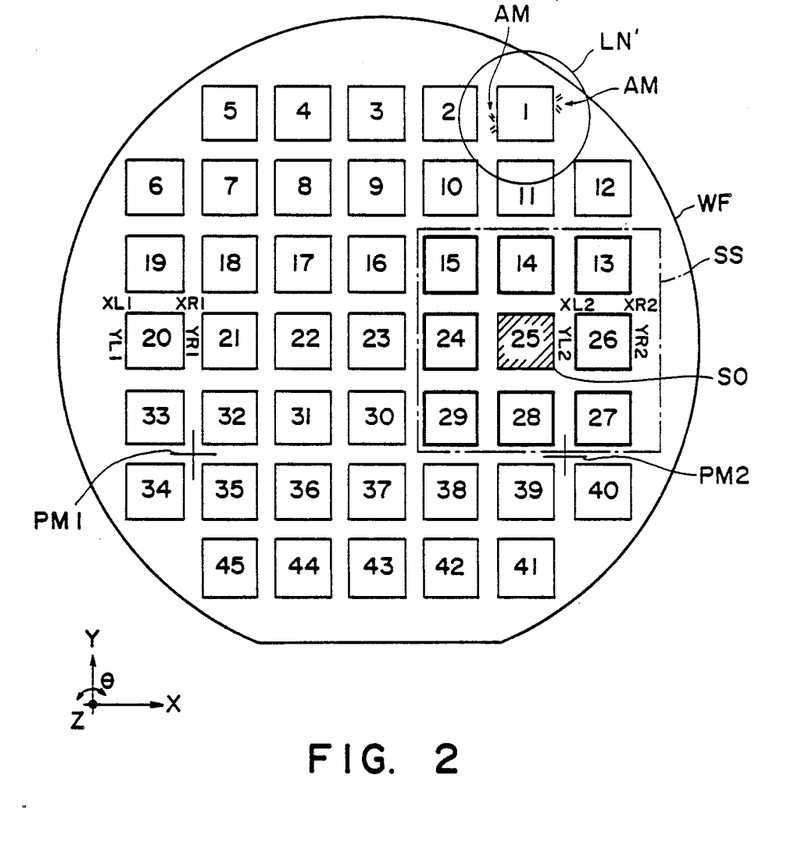
FIG. 2 is a schematic view showing an example of layout of shots on a wafer.

FIG. 2 shows an example of a layout of shots on the wafer WF which is an object to be exposed. The prealignment marks PM1 and PM2 are used for the sake of prealignment which will be described later. Denoted in FIG. 2 by numerals 1–45 are shot areas of the wafer WF which are to be exposed to the reticle pattern in the step-and-repeat manner. Denoted at SO is a particular shot area which is selected or designated to be used in preparation for the sake of global alignment. Also, character SS denotes shot areas which are juxtaposed to the designated shot area SO. In this example, the shot area No. 25 is selected as the designated shot area. In scribe lines each defined between two adjacent shot areas, there are formed alignment marks AM. These alignment marks are so formed that a pair of alignment marks are provided at opposite sides of one shot area. For the sake of simplicity, only the alignment marks related to the first shot area are illustrated in FIG. 2. Denoted at LN' is a projection field of the projection lens system LN, the projection field being depicted in FIG. 2 with reference to the first shot area.

Figure 3:
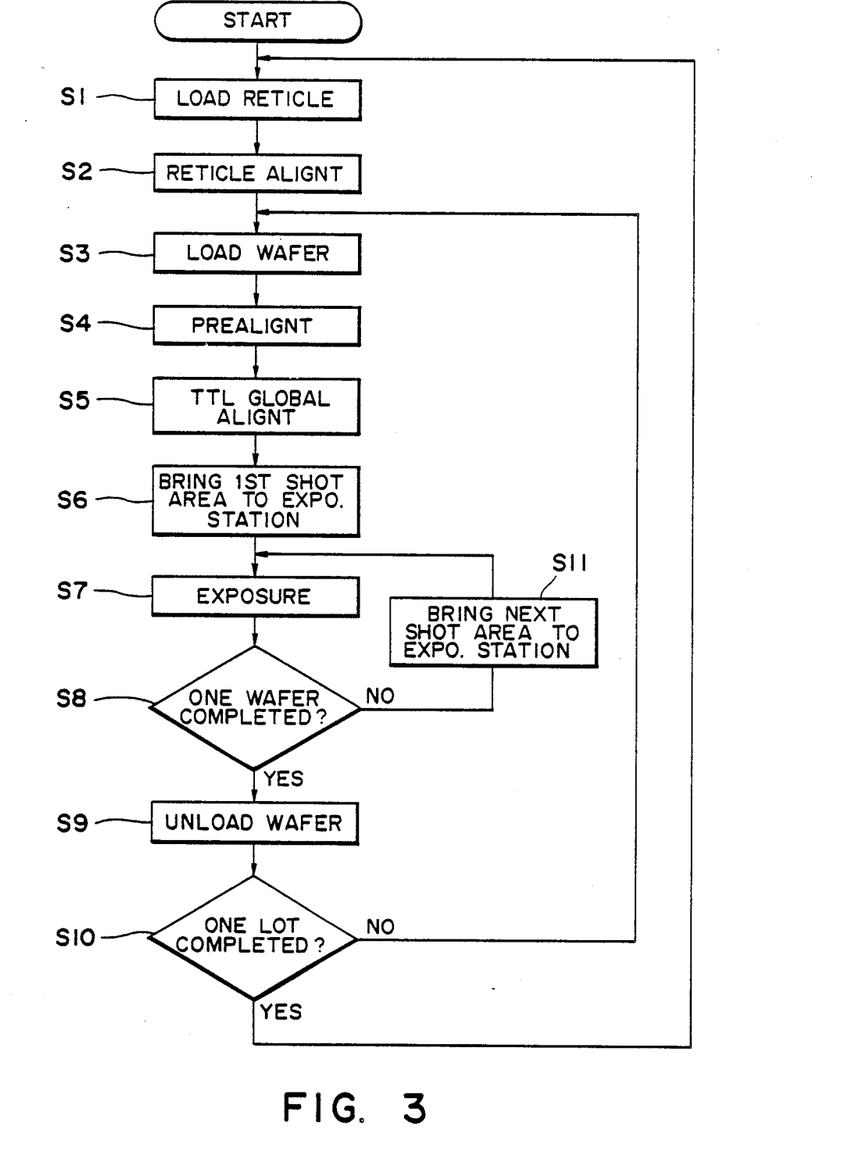
FIG. 3 is a flow chart showing alignment and exposure operations in the projection exposure apparatus of FIG. 1.
Figure 4:
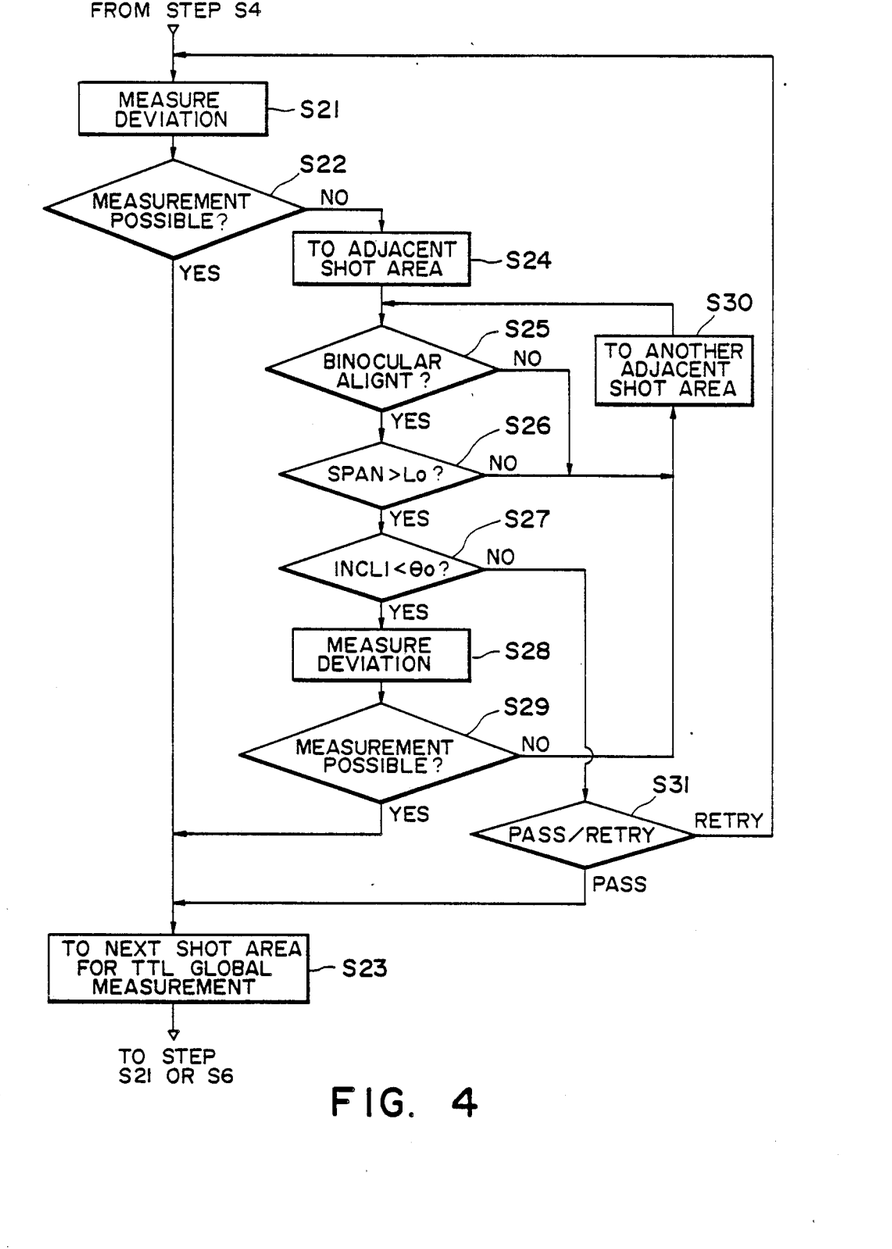
FIG. 4 is a flow chart showing the manner of alignment according to an embodiment of the alignment method of the present invention.

FIG. 3 is a flow chart showing the flow of operations to be made in the apparatus of FIG. 1, in accordance with an embodiment of the present invention, when the wafer WF is to be exposed to the reticle pattern by use of the alignment method according to the present invention. Also, FIG. 4 is a flow chart showing details of the alignment operation to be made at step S5 in FIG. 3.

Description will now be made to the step-and-repeat exposure operation, taken in conjunction with the flow chart of FIG. 3.

When the operation starts, the reticle RT is placed on the reticle stage RS (step S1). Then, at step S2, the reticle RT and the projection lens system LN are brought into a predetermined positional relation by use of one or more reticle setting marks (not shown) provided on the reticle RT and one or more reticle reference marks (not shown) provided on the projection lens system LN. Subsequently, a wafer such as at WF in FIG. 2 onto which the reticle pattern is to be actually photoprinted, is placed on the X-Y stage XYS (step S3). Next, at step S4, the prealignment marks PM1 and PM2 formed on the wafer WF are detected by means of the off-axis microscope OA which is disposed outside the projection lens system LN. On the basis of the detection, the position of the wafer WF relative to the reticle RT is relatively roughly adjusted. Thereafter, at step S5, accurate alignment of the reticle RT and the wafer WF is performed by use of the projection lens system LN, i.e. in the TTL global alignment manner. After the accurate alignment of the reticle RT and the wafer WF is achieved, the X-Y stage XYS is actuated at step S6 so as to bring the first shot area of the wafer WF into the projection field LN' of the projection lens system LN to thereby accurately position the first shot area of the wafer WF with respect to an image of the reticle pattern PT. Then, at step S7, the first shot area of the wafer WF is exposed to the reticle pattern by use of light from the illumination system LI. After this, at step S8, discrimination is made as to whether exposures of all the shot areas of the wafer WF are completed. If not completed, then the sequence goes to step S11 so that the X-Y stage XYS is moved again to bring the next shot area of the wafer to a position under the projection lens system LN, i.e. in the projection field LN'. Thus, the photoprinting operation at step S7 is carried out again. When exposures of all the shot areas of one wafer are completed, the sequence goes to step S9 whereby the exposed wafer WF is unloaded from the X-Y stage XYS. At step S10, discrimination is made as to whether or not wafers of a number that corresponds to a preset number of wafers in one "lot", have been subjected to the exposure operation. If not, then the sequence goes back to step S3. If completed, on the other hand, the sequence goes back to step S1.

Referring now to the flow chart of FIG. 4, description will be made to the manner of TTL global alignment according to an embodiment of the present invention.

In this embodiment, a pair of shot areas on the wafer are selected and used in preparation with respect to the measurement for the TTL global alignment. From the point of view of alignment accuracy and the like, it is desired that the shot areas to be used for the measurement in relation to the TTL global alignment are so selected as to satisfy the following conditions:

(1) Each of the shot areas to be selected allows automatic binocular alignment wherein both the detectors DR and DL detect alignment marks AM, respectively.

(2) The pair of shot areas with respect to which the measurement is to be executed, are spaced from each other by a distance not shorter than a predetermined distance (span).

(3) The pair of shot areas with respect to which the measurement is to be executed, do not cause inclination $\theta$, in respect to their Y-axis positions defined on a wafer which is in a particular orientation (i.e. a rotational component about the Z axis), of a degree greater than a predetermined amount.

In this embodiment, the shot area of No. 25 shown in FIG. 2 is selected as one of the two shot areas to be used for the TTL global alignment. Thus, at step S21 in FIG.

4, any positional deviation of that shot area with respect to the reticle RT is measured. For this measurement, the alignment marks AM of the shot area 25 and marks (not shown) formed on the reticle RT are detected by use of the detectors DR and DL with the aid of the projection lens system LN. Subsequently, at step S22, discrimination is made as to whether or not the measurement has been actually accomplished at step S21. If accomplished, then the sequence goes to step S23 and the wafer is moved so that the other of the two designated shot areas (e.g. shot area of No. 20 in FIG. 2) is placed at a position under the projection lens system LN for the sake of measurement. Thus, the sequence thereafter goes back to step S21. If, at step S22, it is discriminated that the measurement has been unattainable because of failure of detecting the alignment marks or for any other reason, the sequence goes to step S24. In this step S24, the wafer is moved so that a certain shot area (e.g. shot area of No. 26 in FIG. 2) which is in the neighborhood of or juxtaposed to the designated shot area (shot area 25 in this example) is placed at the position under the projection lens system LN. Subsequently, the following discriminations are made at steps S25–S27. That is, at step S25, whether or not the condition (1) described hereinbefore is satisfied is discriminated. At step S26, whether or not the condition (2) is satisfied is discriminated. At step S27, whether or not the condition (3) is satisfied is discriminated. Thus, of the shot areas juxtaposed to the designated shot area, one which satisfies the conditions (1)–(3) is selected as the shot area to be used for the measurement, in place of the designated shot area (No. 25 in this example). Thereafter, at step S28, any positional deviation of that shot area with respect to the reticle RT is measured in the manner similar to that made at step S21. Then, at step S29, discrimination similar to that made at step S22 is performed. If the measurement has been actually achieved, the sequence goes to step S23.

If, at step S25 or S26, it is discriminated that the specified condition is not satisfied, or if at step S29 it is discriminated that the measurement has not been attainable, then, the sequence goes to step S30. At this step S30, a different one of the shot areas which are juxtaposed to the designated shot area (No. 25 in this example) is selected. For example, the shot area of No. 24 in FIG. 2 is selected. Then, the processes described with reference to steps S25–S29 are repeated. If, on the other hand, the condition which has been set with respect to step S27 is not satisfied, that is, when the above-described condition (3) is not satisfied although the conditions (1) and (2) are satisfied, it is discriminated that there is no shot area that can be substituted for the designated shot area. Accordingly, the sequence goes to step S31, and whether the measurement regarding that shot area should be passed over or should be retried is determined. This determination is made by an operator. If the measurement is to be passed over, the sequence goes to step S23. If it is to be retried, the sequence goes back to step S21.

The selection of the substituting shot area, of the shot areas adjacent to the designated shot area, is made in accordance with the selecting conditions which will be described later. The neighboring shot areas are selected in the order determined by these selecting conditions. If, therefore, with regard to one of the neighboring shot areas, it is discriminated at step S27 that the condition (3) is not satisfied, it means that any one of the neighboring shot areas can not substitute for the designated shot area such as at 25 in the FIG. 2 example.

As described, in accordance with the present invention, any failure to attain deviation measurement at a designated shot area does not cause interruption of the alignment operation since, in such occasion, a more suitable substitute shot area for the designated shot area is automatically selected in accordance with the three conditions set forth hereinbefore.

At step S23, if the measurement with respect to the shot areas of the preset number (two in this example) is completed so that there is no further shot area with respect to which the measurement is to be executed, the positional deviation of the wafer as a whole with respect to the reticle pattern RT is calculated. Then, the position of the wafer is adjusted. Thus, the global alignment is accomplished. Thereafter, the sequence goes to step S6 in FIG. 3.

Details of the selection of one of the neighboring shot areas, substituting the designated shot area, will now be described.

In the present embodiment, as described, the shot area No. 25 in FIG. 2 is one of the designated shot areas SO which are preselected as those to be used for the measurement in relation to the global alignment. In this example, as will be seen from FIG. 2, there are eight shot areas (shot areas of Nos. 13, 14, 15, 24, 26, 27, 28 and 29) which are juxtaposed to or adjacent the designated shot area No. 25. Here, on the basis of the conditions (2) and (3) of the above-described three conditions, the following conditions are set in respect to the selection to be made to these neighboring shot areas. That is:

(4) To select one that causes minimum reduction in the span, if any, and minimum inclination, if any.

(5) Where the reduction in span and the inclination are unavoidable, a shot area that causes minimum inclination should be selected.

(6) Where there are two shot areas both of which satisfy the same conditions, such one of them that has a lower shot No. should be selected.

These conditions are determined chiefly so as to accurately detect a rotational error ($\theta$-deviation) on the basis of detection of the deviations at the shot areas at which the measurement is executed and of the span (interval) between these shot areas, thereby to accurately correct the rotational error. That is, the rotational error is detectable by dividing the difference in the positional deviation at two shot areas by a span therebetween. Therefore, with a shorter span, the accuracy of detecting the rotational error decreases. Also, if the spanning direction of two shot areas selected has a large inclination relative to the X direction, the correction of the rotational error is adversely affected in a degree that can not be disregarded. For these reasons, the conditions (4) and (5) are set. The condition (6) is determined only for smoothly proceeding with the shot selection.

Where the selection is made in accordance with the conditions (4)–(6), the order of selection to be made to the eight neighboring shot areas is in the sequence No. 26, No. 24, No. 13, No. 27, No. 14, No. 28, No. 15 and No. 29. On the basis of this order, the selection of such area that substitutes for the designated shot area where the measurement of the deviation is not attainable, is made to these neighboring shot areas in accordance with the conditions described.

In the alignment method of the present embodiment, as described, if the measurement of positional deviation for the TTL global alignment is not attainable with respect to a particular shot area which is designated, another shot area substituting for the designated shot area is automatically searched and the measurement is made with respect to the substituting shot area. Accordingly, even if the measurement with respect to a particular shot area designated is not attainable, interruption of the operation of the apparatus can be avoided, whereby the throughput of the apparatus can be improved significantly.

Also, with regard to a designated shot area with respect to which the measurement has to be passed over in accordance with conventional alignment methods, the present embodiment allows measurement of the positional deviation with respect to an adjacent shot area. Therefore, high-accuracy alignment is attainable.

Figure 5:
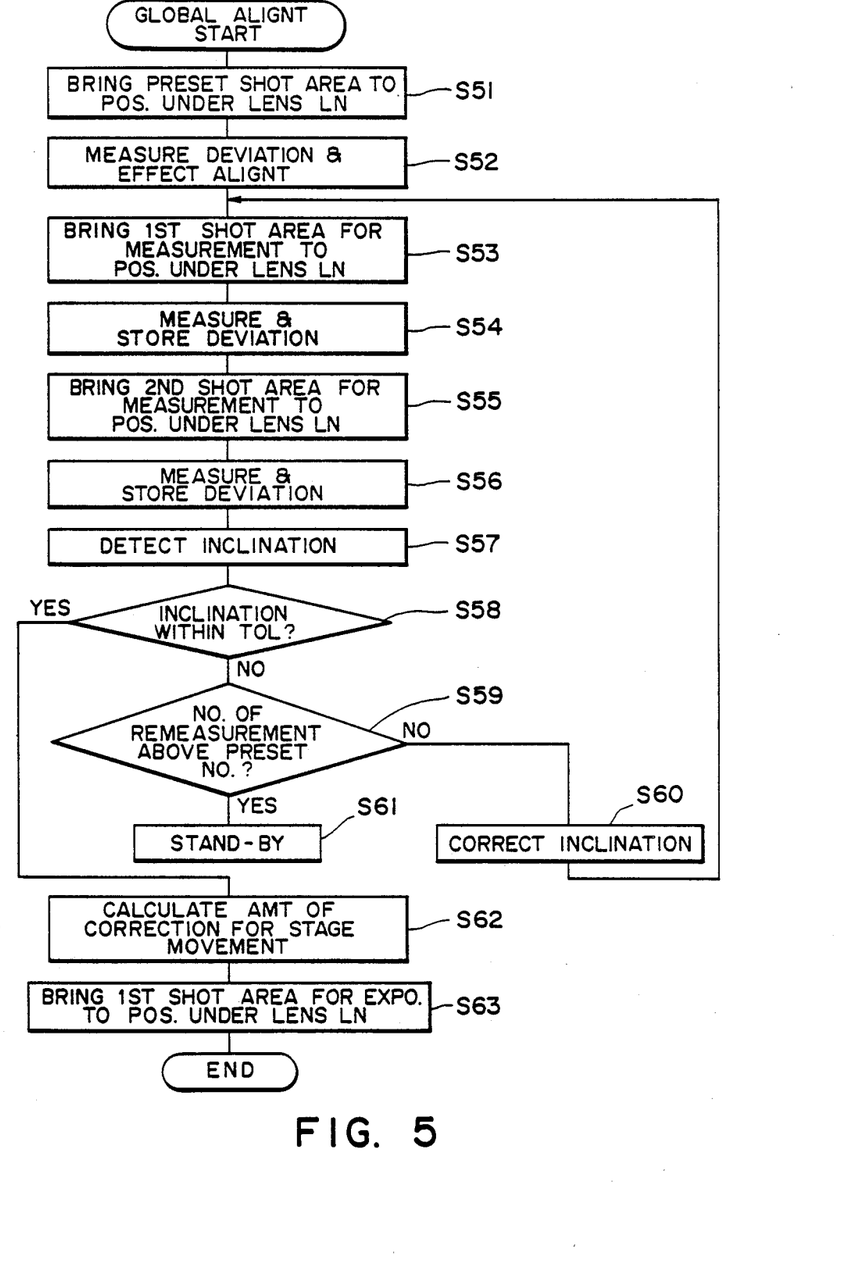
FIG. 5 is a flow chart showing the manner of alignment according to another embodiment of the alignment method of the present invention.

Referring now to FIG. 5, description will be made to a global alignment method according to another embodiment of the present invention.

First, at step S51, the X-Y stage XYS is moved by means of the driving motors XM and YM so that one shot area (e.g. shot area of No. 23 in FIG. 2), which in preparation is designated, is placed underneath the projection lens system LN. Subsequently, at step S52, any positional deviation between the alignment marks AM of the shot area 23 of the wafer WF and marks (not shown) formed on the reticle RT, as superimposed by means of the projection lens system LN, is measured by use of the detectors DR and DL with the aid of the reflecting mirrors MR and ML. On the basis of the results of measurement, the alignment of the shot area 23 with the reticle RT is effected in each of the X, Y and $\theta$ directions.

Next, at step S53, a first shot area for the deviation measurement, (e.g. shot area of No. 20 in FIG. 2), which in preparation is designated, is moved to a position underneath the projection lens system LN. Then, at step S54, any positional deviation of alignment marks AM formed at opposite sides of this shot area is measured by use of the detectors DR and DL. The data concerning the thus detected deviation is stored in a memory such as a random access memory provided in the control box CB. For the sake of explanation, the deviation is denoted in this Specification as follows:

XR1: The amount of deviation of the right-hand mark in the X direction;
YR1: The amount of deviation of the right-hand mark in the Y direction;
XL1: The amount of deviation of the left-hand mark in the X direction; and
YL1: The amount of deviation of the left-hand mark in the Y direction.

At step S55, a second shot area for the deviation measurement (e.g. shot area of No. 26 in FIG. 2), which in preparation is also designated, is moved to a position underneath the projection lens system LN. Then, at step S56, the deviation of this shot area is measured by use of the detectors DR and DL. The data concerning the detected deviation is stored into the above-described memory. For the sake of explanation, the deviation detected secondly is denoted by XR2, YR2, XL2 and YL2, similarly to the deviation detected first.

On the basis of the results of deviations stored in the memory, any inclination of the wafer is detected at step S57. Namely, the calculation according to the following equation is executed:

$$\theta = \{(YR2 + YL2) - (YR1 + YL1)\}/2S$$

The amount "$\theta$" detectable by this calculation is the inclination of the wafer WF. In this equation, S is the distance between centers of shot areas used for the measurement.

At step S58, discrimination is made as to the magnitude of the inclination $\theta$. If at step S58 it is discriminated that an absolute value of the inclination $\theta$ is greater than a predetermined value, the sequence goes to step S59 at which discrimination is made as to the number of remeasurements. That is, how many times remeasurements (retries) have been made to one wafer, is discriminated. If the number is greater than a predetermined value, it shows that the inclination $\theta$ (rotational error) of the wafer can not be corrected satisfactorily. Accordingly, the sequence goes to step S61 so that the apparatus is brought into a stand-by state, interrupting the sequence and waiting for the operator's instructions.

Where at step S59 the number of remeasurements is not greater than the predetermined value, the sequence goes to step S60 whereby the $\theta$ stage WS is rotationally moved by an amount corresponding to "$-\theta$". In this manner, according to this embodiment of the present invention, the inclination of the wafer WF as a whole is detected on the basis of the deviations concerning two shot areas on the wafer WF which are spaced from each other sufficiently. Accordingly, with respect to the rotational error, more accurate value is detectable as compared with the value of inclination which is detected on the basis of detection of the deviations of the right-hand and left-hand marks of one shot area, made at step S52. Therefore, more accurate alignment with less "die rotation" is attainable.

After the $\theta$ stage WS is rotationally moved at step S60, the sequence goes back to step S53 so as to effect again measurement of deviation of the designated first and second shot areas.

If, on the other hand, it is discriminated at step S58 that the absolute value of the inclination $\theta$ detected at step S57 is not greater than the predetermined value, the sequence goes to step S62 whereby an amount of correction for correcting the amount of movement to be made by the X-Y stage XYS is calculated. Namely, the inclination $\theta$ detected at step S57 and an expansion rate M of the wafer, which is detectable in accordance with the following equation, are taken as the amount of correction for the movement of the X-Y stage XYS:

$$M = \{(XR2 + XL2) - (XR1 + XL1)\}/2S$$

On the basis of the inclination $\theta$ and the expansion rate M, the X-Y stage XYS is operable in response to an instruction signal, instructing the movement of an amount (x, y), to move by an amount (x', y') determined by the following equations:

$$x' = (1+M)x - \theta y$$

$$y' = \theta x + (1+M)y$$

By making the correction described above, the X-Y stage XYS is allowed to move to closely follow the inclination of the arrays of the shot areas on the wafer WF and the expansion of the wafer WF.

Subsequently, at step S63, the X-Y stage XYS is moved so as to feed a first shot area, which is predetermined in respect to the exposure, to a position underneath the projection lens system LN. For this movement, an instruction signal is supplied to the driving motors XM and YM so as to move the X-Y stage XYS by an amount ($x_1$, $y_1$) determined as follows:

$$x_1 = WX - (XR2 + XL2)/2$$

$$y_1 = WY - (YR2 + YL2)/2$$

wherein WX and WY are the amounts of movement in the X and Y directions, respectively, necessary for the X-Y stage XYS, in a case where no inclination and expansion are caused in the wafer WF, to displace the wafer WF, whose second shot area preselected for the deviation measurement is under the projection lens system LN, to a position whereat the first shot area for exposure is placed underneath the projection lens system LN.

In this manner, according to the present embodiment, high-accuracy global alignment is attainable stably.

While the invention has been described with reference to the structures disclosed herein, it is not confined to the details set forth and this application is intended to cover such modifications or changes as many come within the purposes of the improvements or the scope of the following claims.

What is claimed is:

1. An aligment method, usable with a workpiece having different portions, for positioning one by one the different portions of the workpiece with respect to a predetermined reference, said method comprising the steps of:
    attempting detection of devation between at least one of the different portions of the workpiece and the predetermined reference;
    discriminating whether the attempted detection has been achieved;
    detecting deviation between another portion of the workpiece, which is in the neighborhood of said at least one portion of the workpiece, and the predetermined reference when the achievement of the attempted detection is not discriminated; and
    positioning one by one the different portions of the workpiece with respect to the predetermined reference in accordance with the detection of the deviation of the workpiece with respect to said at least one portion when the achievement of the attempted detection is discriminated, and in accordance with the detection of the deviation of the workpiece with respect to said other portion when the achievement of the detection is not discriminated.

2. A method according to claim 1, wherein a portion of the workpiece which is juxtaposed to said at least one portion is selected as said other portion.

3. A method according to claim 2, wherein at the attempted detection deviation step, a first portion and a second portion of the workpiece which are spaced by a predetermined distance from each other are used and wherein, when the detection of the workpiece deviation with respect to said second portion is not accomplished, a third portion which is farther from said predetermined distance from said first portion is selected at the detecting deviation step.

4. An alignment method, usable in advance of step-and-repeat exposure of a wafer having different shot areas, for positioning the wafer by use of at least one shot area thereof, said method comprising the steps of:
    attempting detection of deviation of the wafer, with respect to one said shot area designated for the alignment, from a reference position;
    discriminating whether the attempted deviation detection can be attained;
    in response to the discrimination that the attempted deviation detection can not be attained, selecting another said shot area of the wafer which is in the neighborhood of the designated shot area; and
    again attempting detection of deviation of the wafer, with respect to the other shot area, from the reference position.

5. An exposure apparatus for exposing a workpiece having different portions to a pattern of a mask, said apparatus comprising:
    means for exposing one said portion of the workpiece to the pattern of the mask;
    means for moving the workpiece to place each of the different portions of the workpiece in position to be exposed to the pattern of the mask by said exposing means;
    means for attempting detection of deviation of at least a designaled one of the portions of the workpiece with respect to a predetermined reference; and
    control means for discriminating whether the attempted detection of deviation by said detecting means has been achieved, and for controlling, in response to the discrimination of the achievement of the attempted deviation detection, the movement of the workpiece by said moving means to place the different portions of the workpiece in position for exposure, in accordance with the detected deviation, said control means further operating, when achievement of the attempted detection of deviation has not been discriminated, to select another said portion of the workpiece that has a predetermined positional relation to said designated portion and to detect deviation of said other portion with respect to the predetermined reference, said control means still further operating to control the movement of the workpiece by said moving means to place the different portions of the workpiece in position for exposure, in accordance with the detected deviation related to said other portion.

6. An apparatus according to claim 5, wherein said exposing means includes a first optical system for illuminating the mask and a second optical system for projecting an image of the pattern of the mask onto a said portion of the workpiece.

7. An alignment method, usable with a workpiece having different portions, for poitioning one by one the different portions of the workpiece with respect to a predetermined reference, wherein at least two portions of the workpiece have alignment marks, said method comprising the steps of:
    attempting detection of one said alignment mark of at least one portion of the workpiece;
    discriminating whether the attempted detection of the alignment mark is achieved;
    detecting an alignment mark of another said portion of the workpiece, which portion is in the neighborhood of said at least one portion, when the achievement of the attempted detection of the one said alignment mark is not discriminated; and positioning one by one the different portions of the workpiece with respect to the reference in accordance with the detection of the one alignment mark of said at least one portion when the achievement of the attempted detection of the alignment mark of said at least one portion is discriminated, and in accordance with the detection of the alignment mark of the other portion when the achievement of the attempted detection of the alignment mark of said at least one portion is not discriminated.

8. An alignment method, comprising the steps of:

aligning a particular shot area on a wafer with a reticle;

measuring and memorizing, after the alignment of the particular shot area, a deviation, with respect to the reticle, of each of first and second shot areas on the wafer which are different from the particular shot area and are spaced by a predetermined distance from each other;

calculating an inclination of the wafer on the basis of the measured and memorized deviations;

9. A method according to claim 8, wherein, when an absolute value of the calculated inclination is not greater than the predetermined value, an expansion rate of the wafer is calculated and wherein the calculated inclination and expansion rate are memorized for use in correcting the subsequent wafer movement.

* * * * *

UNITED STATES PATENT AND TRADEMARK OFFICE
CERTIFICATE OF CORRECTION

PATENT NO. : 4,881,100
DATED : November 14, 1989
INVENTOR(S) : AKIYA NAKAI, ET AL.

Page 1 of 2

It is certified that error appears in the above-identified patent and that said Letters Patent is hereby corrected as shown below:

COLUMN 1

Line 12, "particularly" should read --particularly,-- and "usable," should read --usable--.

COLUMN 2

Line 30, "first and second detections" should read --first and second directions--.

COLUMN 3

Line 13, "wafer WS," should read --wafer WF,--.
   Line 15, "WS" should read --WF--.

COLUMN 7

Line 24, "of" should be deleted.
   Line 37, "of" should be deleted.
   Line 56, "of" should be deleted.

COLUMN 9

Line 25, "many" should read --may--.
   Line 29, "aligment method," should read --alignment method,--.

COLUMN 10

Line 25, "designaled" should read --designated--.
   Line 55, "poitioning" should read --positioning--.

UNITED STATES PATENT AND TRADEMARK OFFICE
CERTIFICATE OF CORRECTION

PATENT NO. : 4,881,100
DATED : November 14, 1989
INVENTOR(S) : AKIYA NAKAI, ET AL.

It is certified that error appears in the above-identified patent and that said Letters Patent is hereby corrected as shown below:

COLUMN 12

Line 8, "deviations;" should read --deviations;
¶ rotationally moving the wafer relative to the reticle by an amount corresponding to the calculated inclination when the calculated inclination is greater than a predetermined value, to thereby correct the position of the wafer; and
¶ measuring and correcting an error of each of the shot areas on the wafer, other than at least said particular shot area.--.

Signed and Sealed this

Fifteenth Day of October, 1991

Attest:

HARRY F. MANBECK, JR.

*Attesting Officer*      *Commissioner of Patents and Trademarks*